(12) United States Patent
Yamada et al.

(10) Patent No.: US 6,226,994 B1
(45) Date of Patent: May 8, 2001

(54) THERMOELECTRIC ELEMENT AND THERMOELECTRIC COOLING OR HEATING DEVICE PROVIDED WITH THE SAME

(75) Inventors: Kazukiyo Yamada, Ibaraki; Isao Morino, Aichi, both of (JP)

(73) Assignees: Sel Application Co., Ltd., Ibaraki; Morix Co., Ltd., Aichi, both of (JP)

( * ) Notice: Subject to any disclaimer, the term of this patent is extended or adjusted under 35 U.S.C. 154(b) by 0 days.

(21) Appl. No.: 09/254,122
(22) PCT Filed: Jul. 2, 1998
(86) PCT No.: PCT/JP98/02984
  § 371 Date: Mar. 1, 1999
  § 102(e) Date: Mar. 1, 1999
(87) PCT Pub. No.: WO99/01703
  PCT Pub. Date: Jan. 14, 1999

(30) Foreign Application Priority Data

Jul. 2, 1997 (JP) .................................... 9-177017

(51) Int. Cl.[7] .................................................. F25B 21/02
(52) U.S. Cl. .................................. 62/3.7; 62/3.2; 136/203
(58) Field of Search ....................... 62/3.7, 3.2; 136/203, 136/204

(56) References Cited

U.S. PATENT DOCUMENTS 5,171,372 * 12/1992 Recine .................................. 136/203
5,441,576 * 8/1995 Bierschenk et al. .................. 136/203

FOREIGN PATENT DOCUMENTS

| 34-595 | * | 2/1959 | (JP) . |
| 361172358 | * | 8/1986 | (JP) . |
| 405160441 | * | 6/1993 | (JP) . |
| 405175556 | * | 7/1993 | (JP) . |
| 8-228027 | | 9/1996 | (JP) . |

* cited by examiner

Primary Examiner—Corrine McDermott
Assistant Examiner—Chen-Wen Jiang
(74) Attorney, Agent, or Firm—Dellett and Walters

(57) ABSTRACT

A thermoelectric element (1) comprises a partitioning plate (2) having electrical insulating properties; equal numbers of p-type thermoelectric semiconductor elements (3A) and n-type thermoelectric semiconductor elements (3B) fixed to the partitioning plate (2) in a state in which they pass through the partitioning plate (2); flat copper electrodes (4) fixed to upper sides of the p-type thermoelectric semiconductor elements (3A) and n-type thermoelectric semiconductor elements (3B); and T-shaped copper electrodes (5) fixed to lower sides of the p-type thermoelectric semiconductor elements (3A) and n-type thermoelectric semiconductor elements (3B). Lower portions protruding from the lower surface of the partitioning plate (2) are accommodated within a cooling vessel and are cooled directly by a coolant or air.

11 Claims, 15 Drawing Sheets

FIG.2
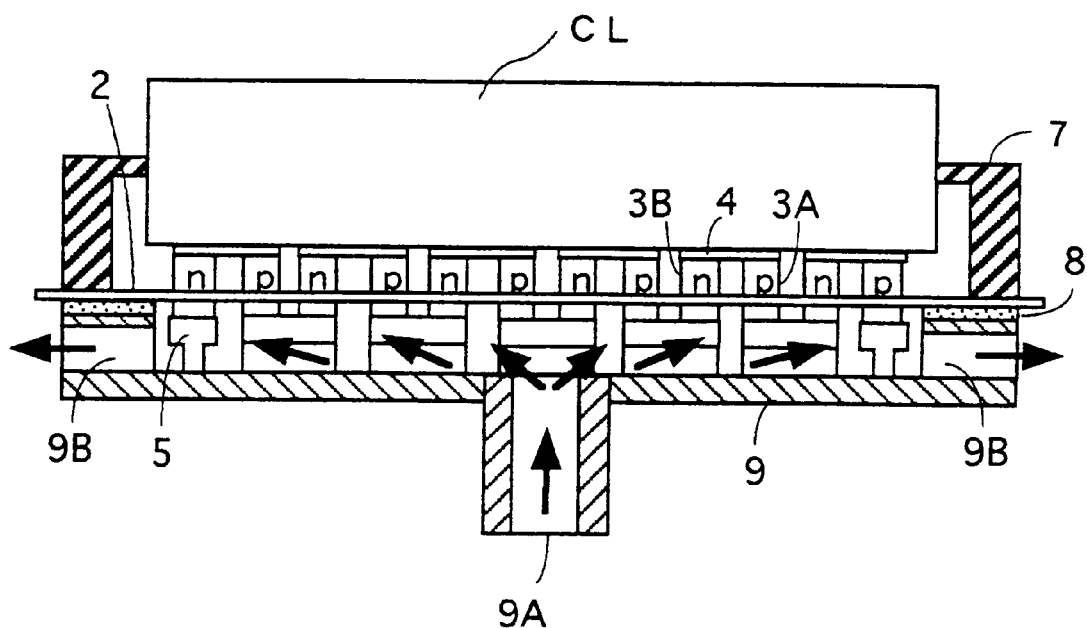
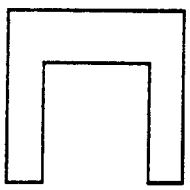
FIG.3A
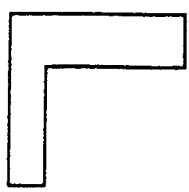
FIG.3B
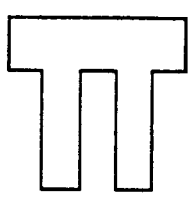
FIG.3C

12M

12A

12A

THERMOELECTRIC ELEMENT AND THERMOELECTRIC COOLING OR HEATING DEVICE PROVIDED WITH THE SAME

FIELD OF THE INVENTION

This invention relates to a thermoelectric element unit that makes use of a thermoelectric semiconductor element, such as a Peltier element, and a thermoelectric cooling or heating device provided with the same.

BACKGROUND OF THE INVENTION

Thermoelectric elements that use thermoelectric semiconductor elements made of compounds such as bismuth/tellurium compounds, iron/silicon compounds, or cobalt/antimony compounds are used in applications such as cooling/heating devices. Such a thermoelectric element is convenient as a cooling/heating source that does not use liquids or gases, takes up little space, is not subject to rotational friction, and does not require maintenance.

This thermoelectric element generally comprises two types of thermoelectric semiconductor element, p-type and n-type, arranged alternately in an array, with the thermoelectric semiconductor elements being connected to electrodes by soldering to form a "π"-shaped series circuit; the thermoelectric semiconductor elements and metal electrodes are sandwiched between ceramic substrates having metal films, and such an assembly is widely used as a thermoelectric module.

The structure of a thermoelectric module that is known in the art is shown in FIGS. 16A and 16B. In this case, FIG. 16A is a front view and FIG. 16B is a perspective view. As shown in these figures, thermoelectric semiconductor elements 63 consisting of n-type and p-type thermoelectric semiconductor elements are arrayed alternately. Upper and lower surfaces of the thermoelectric semiconductor elements 63 are connected with the upper surfaces thereof being connected by metal electrodes 62 and the lower surfaces thereof being connected by metal electrodes 64, so that all of the thermoelectric semiconductor elements 63 are eventually connected electrically in series. The connections between the upper and lower metal electrodes 62 and 64 and the thermoelectric semiconductor elements 63 are performed by soldering. The metal electrodes 62 and 64 at the upper and lower sides are connected onto metallized ceramic substrates 61 and 65, respectively, to fix the entire assembly together. The thus constructed thermoelectric element is usually called a thermoelectric module.

A DC power source is connected to electrodes at each end of this thermoelectric module, and, when a current flows in the direction from each n-type thermoelectric semiconductor element to a p-type thermoelectric semiconductor element, the Peltier effect ensures that the upper portion of the "π" shape acts as an absorbing-side cold junction (CJ) and the lower portion thereof acts as a radiating-side hot junction (HJ). Reversing the connection direction of the power source changes the directions in which heat is absorbed and emitted. This phenomenon is utilized so that the thermoelectric element can be used in a cooling/heating device.

Such a thermoelectric module is useful in a wide range of applications, from the cooling of devices such as large-scale integrated circuits (LSIs), computer central processing units (CPUs), and lasers, to use in insulated refrigerators.

If such a thermoelectric module is used as a cooling device, it is necessary to disperse heat efficiently from the heat-radiating side. Methods that are used in the art for dispersing heat from the heat-radiating side of a thermoelectric module include an air-cooling method wherein radiator fins 71 are attached to the heat-radiating side of the thermoelectric module 60 and an air-flow from a fan 72 is directed towards those radiator fins 71, as shown in FIG. 17A, and a liquid-cooling method wherein a liquid-cooling jacket 81 is attached to the heat-radiating side of the thermoelectric module 60 and a coolant passes within this liquid-cooling jacket 81. In addition, a Peltier cooling device is known, which uses aluminum substrates with oxidized surfaces instead of the ceramic surfaces, and which is capable of efficiently cooling the aluminum substrate on the heat-radiating side by using a liquid-cooling jacket provided with injection nozzles. Note that the hollow arrows in FIG. 17A indicate the flow of air and the solid arrows in FIG. 17B indicate the flow of coolant. In both FIGS. 17A and 17B, CL denotes a cooling load.

However, since the thermoelectric semiconductor elements in each of these cooling devices have a structure such that they are cooled indirectly through a ceramic substrate on the lower sides thereof, the heat cannot be dispersed efficiently from the heat-radiating side of the thermoelectric module. In addition, the ceramic substrates 61 and 65 that are fixed above and below the thermoelectric module of FIG. 16A form a rigid structure, so that large thermal stresses are inevitably applied to the thermoelectric semiconductor elements 63 during operation, and thus the lifetime of these thermoelectric semiconductor elements is short.

It is therefore an objective of this invention to provide a thermoelectric element which can minimize any drop in the cooling efficiency is minimized and also extract the maximum from the capabilities of thermoelectric semiconductor elements, by directly cooling the thermoelectric semiconductor elements and metal electrodes on a heat-radiating side thereof.

Another objective of this invention is to provide a thermoelectric element that can have an extended lifetime, by reducing thermal stresses applied to the thermoelectric semiconductor elements.

A further objective of this invention is to provide a thermoelectric cooling or heating device that has a high level of cooling efficiency or heating efficiency, by using this thermoelectric element.

A still further objective of this invention is to provide a thermoelectric cooling or heating device that can keep the temperature of a heat exchange fluid at a constant value, even when it is used over a long period of time or when the ambient temperature changes.

SUMMARY OF THE INVENTION

A thermoelectric element in accordance with this invention comprises: a partitioning plate having electrical insulating properties; a p-type thermoelectric semiconductor element and an n-type thermoelectric semiconductor element fixed to the partitioning plate in a state passing through the partitioning plate; a first metal electrode connected to a first surface of the p-type thermoelectric semiconductor element and the n-type thermoelectric semiconductor element; and a second metal electrode connected to a second surface of the p-type thermoelectric semiconductor element and the n-type thermoelectric semiconductor element.

A thermoelectric cooling or heating device in accordance with this invention comprises the structural essentials of the thermoelectric element of this invention, and is further provided with a heat exchange vessel for accommodating said second metal electrode and the portions of said thermoelectric semiconductor element that protrude from said partioning plate on the side of the second metal electrode and also for accepting the passage of a fluid for heat exchange therethrough.

In the thermoelectric element in accordance with this invention, there is no ceramic substrate fixed to either of the first metal electrode and the second metal electrode, thus reducing thermal stresses applied to the thermoelectric semiconductor elements.

In addition, the second metal electrode and the portions of the p-type thermoelectric semiconductor element and the n-type thermoelectric semiconductor element that protrude from the partitioning plate on the side of the second metal electrode, are directly cooling or heating within the heat exchange vessel of the thermoelectric cooling or heating device of this invention, so the cooling or heating efficiency thereof is increased.

Furthermore, in the thermoelectric cooling or heating device of this invention, the second metal electrode has a shape such that the surface area of the surface that is fixed to the p-type thermoelectric semiconductor element and the n-type thermoelectric semiconductor element is larger than the surface area of the surface opposite thereto, so that spaces are provided within the heat exchange vessel, smoothing the flow of fluid into and out of the heat exchange vessel and also increasing the surface area in contact with the coolant, thus improving the thermal radiation efficiency.

It is also possible to keep the temperature of a heat exchange fluid at a constant value, even when it is used over a long period of time or when the ambient temperature changes, by providing a liquid temperature control means for controlling the temperature of the heat exchange fluid on the exterior of the heat exchange vessel in the thermoelectric cooling or heating device of this invention. This makes it possible to remove the necessity of varying the current applied to the thermoelectric element depending on changes in the ambient temperature, thus enabling stable cooling/heating control.

BRIEF DESCRIPTION OF THE DRAWINGS

FIG. 2 shows a thermoelectric cooling unit that uses the thermoelectric element of FIG. 1;

FIGS. 3A–3C show other examples of the structure of the electrode on the heat-radiating side of the thermoelectric element of this invention;

BEST MODE FOR CARRYING OUT THE INVENTION

Figure 1A:
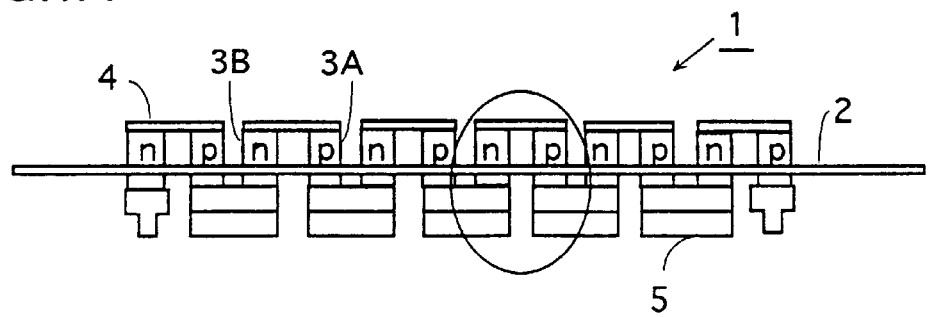
FIGS. 1A–1E show the structure of an example of a thermoelectric element in accordance with this invention.

A front view of an example of the structure of a thermoelectric element in accordance with this invention is shown in FIG. 1A. One characteristic of this thermoelectric element is the fact that it has a configuration wherein p-type thermoelectric semiconductor elements 3A and n-type thermoelectric semiconductor elements 3B are fixed to a partitioning plate 2 in a state such that they pass therethrough. Flat copper electrodes 4 are connected by soldering to upper surfaces of the p-type thermoelectric semiconductor elements 3A and the n-type thermoelectric semiconductor elements 3B, and copper electrodes 5 having side surfaces in the shape of the letter T (hereinafter called "T-shaped copper electrodes") are connected by soldering to lower surfaces thereof. Another characteristic of this structure is that the copper electrodes at the lower surfaces of the thermoelectric semiconductor element are T-shaped. In addition, no ceramic substrate is provided on either the upper surfaces of the copper electrodes 4 or the lower surfaces of the T-shaped copper electrodes 5. The resultant structure in which substrates are not fixed to the metal electrodes, leaving them bare, is called a skeleton structure. Since the upper and lower metal electrodes of the thermoelectric element shown in FIG. 1 are both bare, this is a double-sided skeleton structure.

The partitioning plate 2 is made of a plate of an electrically insulating substance, such as glass epoxy, of a thickness of 0.3 to 0.6 mm, by way of example. The p-type and n-type thermoelectric semiconductor elements 3A and 3B are configured of semiconductor monocrystals of a material such as bismuth telluride in a circular or square cylindrical shape, with a length on the order of 1.5 to 2 mm and a cross-sectional area on the order of 1.7 to 3.2 mm2 (square millimeters). They are fixed to the lower side of the partitioning plate 2 in a state in which they protrude on the order of 0.5 to 0.8 mm therefrom. Note that the means of implementing this structure, wherein thermoelectric semiconductor elements are fixed to a single partitioning plate in a state such that they pass therethrough, is described in detail in Japanese Patent Application No. 7-276751 (Japanese Patent Application Laid-Open No. 8-228027) so further description thereof is omitted.

Figure 1B:
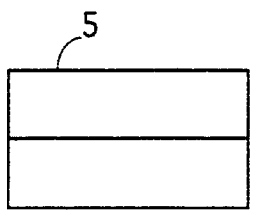
Figure 1C:
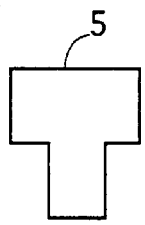
Figure 1D:
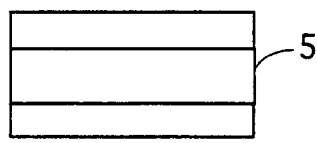

An enlarged front view of one of the T-shaped copper electrodes 5 of FIG. 1A is shown in FIG. 1B, an enlarged side view thereof is shown in FIG. 1C, and an enlarged bottom view is shown in FIG. 1D. The seven T-shaped copper electrodes 5 shown in FIG. 1A are all of the same shape and dimensions, but the two outermost ones are orientated and attached in such a manner that the side surfaces thereof are visible, as shown in FIG. 1C, and the other five are orientated and attached in such a manner that the front surfaces thereof are visible, as shown in FIG. 1B.

Figure 1E:
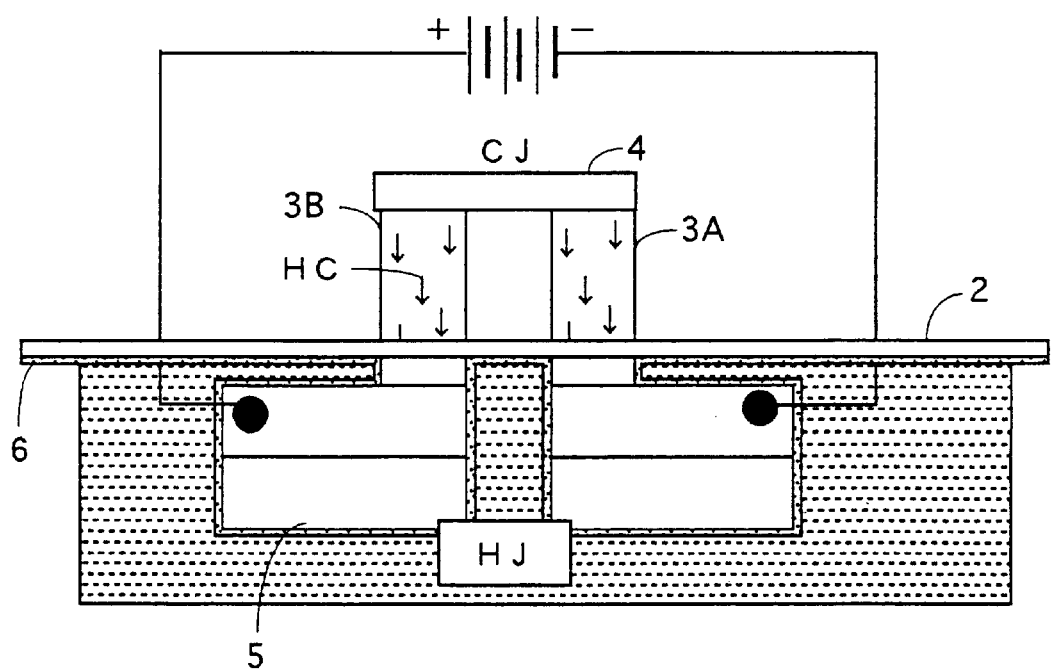

The operation of the thermoelectric element of FIG. 1A is illustrated in FIG. 1E, which is an enlargement of the pair of thermoelectric semiconductor elements shown encircled in FIG. 1A. When the thermoelectric module of FIG. 1A is in use, a portion of each of the p-type thermoelectric semiconductor elements 3A and the n-type thermoelectric semiconductor elements 3B positioned below the partitioning plate 2 is in direct contact with a gas such as air or a coolant, and heat is removed thereby (in FIG. 1E, the portions shown hatched below the partitioning plate 2 are in direct contact with a gas such as air or a coolant). Since the T-shaped copper electrodes 5 are located within the coolant or the like, they are preferably subjected to a surface processing such as nickel plating. In addition, to prevent oxidation or corrosion of the T-shaped copper electrodes 5 by the coolant, a coating 6 of silicon resin or the like is preferably formed thereover, including the surfaces in contact with the thermoelectric semiconductor elements.

Since the thermoelectric element of FIG. 1 thus has a double-sided skeleton structure, the thermal stresses applied to the thermoelectric semiconductor elements are reduced thereby and, as a result, the lifetime of the thermoelectric semiconductor elements is extended. Since the heat-radiating side is cooled directly, the thermal radiation thereof is improved.

A thermoelectric cooling unit that uses the thermoelectric element of FIG. 1 is shown in FIG. 2. In this figure, components that are the same as those shown in FIG. 1, or are equivalent to those shown in FIG. 1, are denoted by the same reference numbers as those used in FIG. 1.

A liquid-cooling jacket 9 is attached to the lower side of the thermoelectric element, as shown in FIG. 2. The liquid-cooling jacket 9 is formed as a substantially box shape, from a material such as aluminum that has been subjected to alumite processing. A liquid inlet 9A is provided in the center of a lower portion of the liquid-cooling jacket 9, and liquid outlets 9B are provided on each side of an upper portion thereof. The edge of the upper side of the liquid-cooling jacket 9 is affixed to the partitioning plate 2 by an adhesive seal 8. A bottom surface within the liquid-cooling jacket 9 is in contact with the lower ends of the T-shaped electrodes 5. In addition, a moisture-proof frame 7 made of resin is disposed around the cooling load CL, fixed by an adhesive seal. Thus the portions of the p-type thermoelectric semiconductor elements 3A and n-type thermoelectric semiconductor elements 3B that protrude from the lower side of the partitioning plate 2, as well as the T-shaped copper electrodes 5 fixed to the lower surfaces thereof, are accommodated within the liquid-cooling jacket 9 and are in direct contact with the coolant.

This configuration ensures that, when a coolant that is stable even when currents are flowing through the thermoelectric elements, such as one in which the main component is ethylene glycol, is routed into the interior of the liquid-cooling jacket 9 from the liquid inlet 9A, this coolant flows within the liquid-cooling jacket 9 and passes on both sides of the T-shaped copper electrodes 5, then flows out of the liquid-cooling jacket 9 from the liquid outlets 9B. During this time, the entry of the coolant from the lower side makes it possible to achieve a better distribution than similar entry from the sides. In addition, the flow of coolant is smoother because of the presence of spaces on both sides of the T-shaped copper electrodes 5, wherein the width of the T is narrow. Making the electrodes T-shaped ensures that the surface area thereof in contact with the coolant is greater than with flat electrodes, so the thermal radiation efficiency thereof is increased.

Note that the shape of the electrodes on the heat-radiating side is ideally such that the surface area of the surface thereof fixed to the thermoelectric semiconductor elements is greater than the surface area of the surface opposite thereto, so the shape could equally well be an inverted-U shape as shown from the side in FIG. 3A (where linear portion at the "base" of the U is fixed to the thermoelectric semiconductor elements), an inverted-L shape as shown from the side in FIG. 3B, or the shape shown from the side in FIG. 3C. Any of these shapes ensures that the flow of coolant is smooth and the surface area in contact with the coolant is large, thus implementing an increase in the thermal radiation efficiency.

Figure 4:
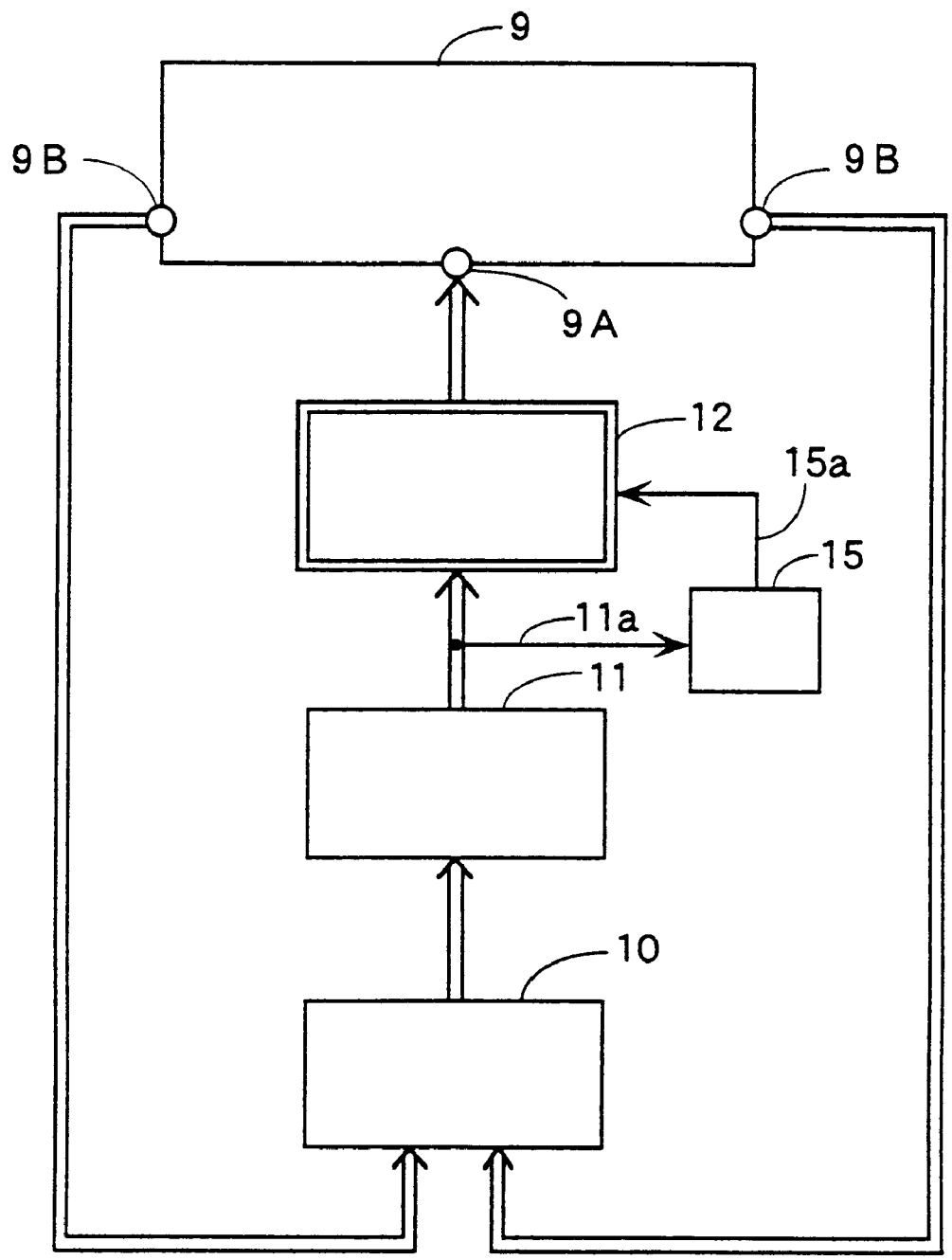
FIG. 4 is a block diagram of an example of the structure of a thermoelectric cooling device in accordance with this invention.

A block diagram of the structure of a circulating-fluid thermoelectric cooling device in accordance with this invention is shown in FIG. 4. In this figure, the circulating-fluid thermoelectric cooling unit 9 is configured as shown in FIG. 2. A circulation system for the coolant, consisting of a radiator 10, a pump 11, and a liquid temperature control unit 12, is formed between the liquid outlets 9B and the liquid inlet 9A of this circulating-fluid thermoelectric cooling unit 9. Note that the pump 11 could equally well be provided on the outlet side of the liquid temperature control unit 12, the inlet side of the radiator 10, or the inlet side of the circulating-fluid thermoelectric cooling unit.

The pump 11 has the role of circulating the coolant. The radiator emits heat from the coolant whose temperature has been raised by heat from the heat-radiating side of the circulating-fluid thermoelectric cooling unit 9. This configuration is well-known in the art. The liquid temperature control unit 12 operates to control the temperature of the coolant to ensure it is constant. The interior of this liquid temperature control unit 12 is provided with a thermoelectric cooling unit. A detection signal 11a indicating the temperature of the coolant at the outlet side of the pump 11 is sent to a control circuit 15. The control circuit 15 sends a predetermined on/off control signal 15a for the liquid temperature control unit 12. In other words, when the detected coolant temperature is greater than or equal to a predetermined temperature, the control circuit 15 sends a control signal for turning on the thermoelectric cooling unit within the liquid temperature control unit 12; when the detected temperature is less than that predetermined temperature, it sends a control signal for turning it off. This control is such that the liquid temperature is maintained to within a constant range. It should be noted, however, that more subtle liquid temperature control could be achieved by controlling the value of the current or voltage applied to the thermoelectric cooling unit. In addition, if the liquid temperature is too low, it is possible to apply control such that the liquid temperature is increased by inverting the polarity of the current or voltage. Note that the temperature of the coolant could equally well be detected at the outlet side of the radiator 10.

Figure 5:
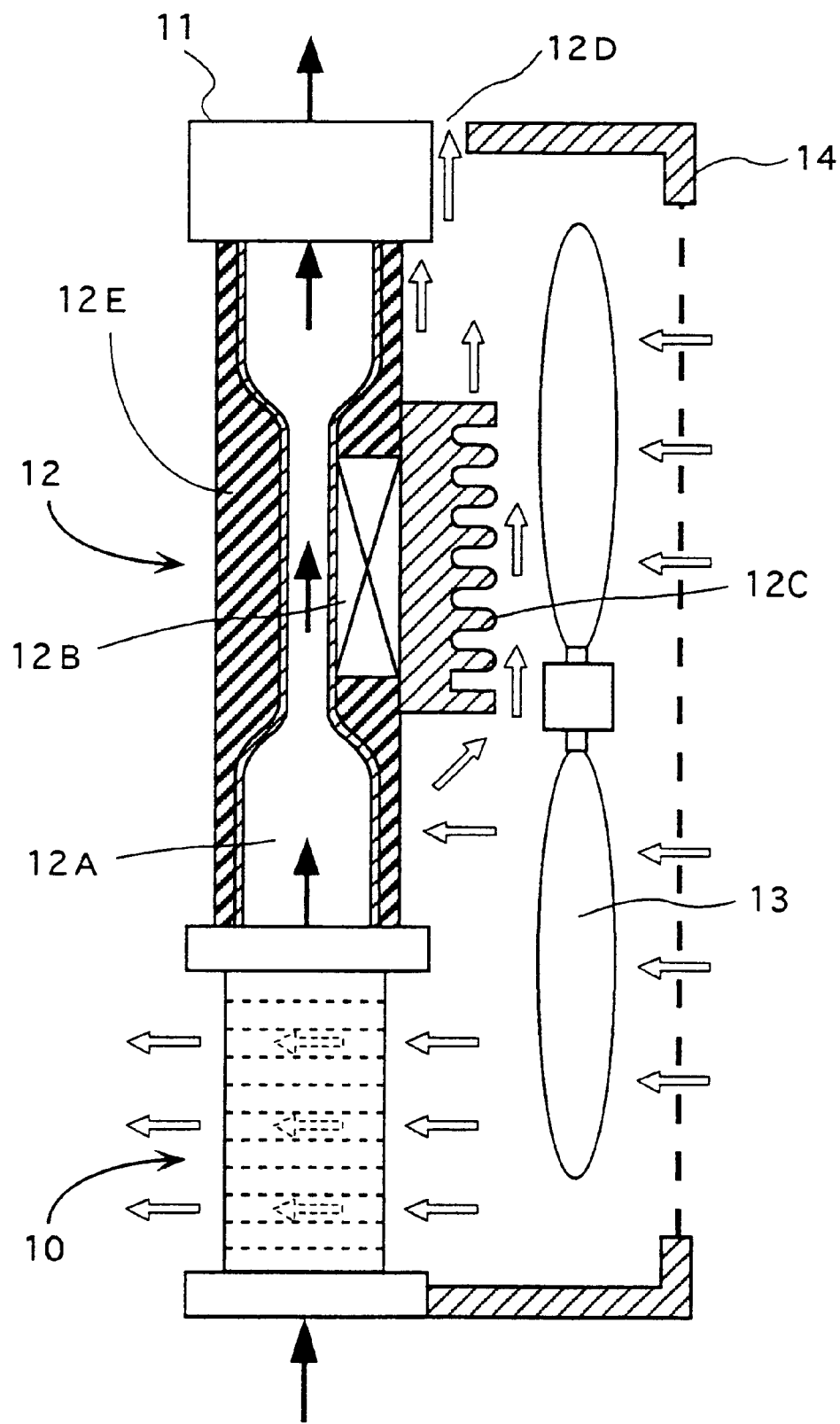
FIG. 5 shows an example of the structure of the liquid temperature control unit of FIG. 4.
Figure 6A:
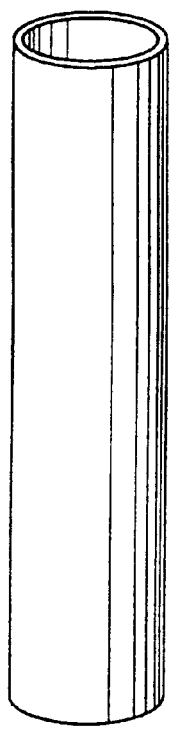
FIGS. 6A–6C are views illustrative of the structure of the heat exchange member of FIG. 5.

An example of the structure of the liquid temperature control unit 12 is shown in FIG. 5. In this figure, components that are the same as those shown in FIG. 4, or are equivalent to those shown in FIG. 4, are denoted by the same reference numbers as those used in FIG. 4. The structure of a heat exchange member 12A is also illustrated in FIGS. 6A to 6C, where FIG. 6A shows a circular cylindrical pipe 12M before the heat exchange member 12A is fabricated therefrom, FIG. 6B shows the heat exchange member 12A as seen from the front view of a flat portion thereof, and FIG. 6C shows the heat exchange member 12A as seen from the side of the flat portion thereof.

Figure 6B:
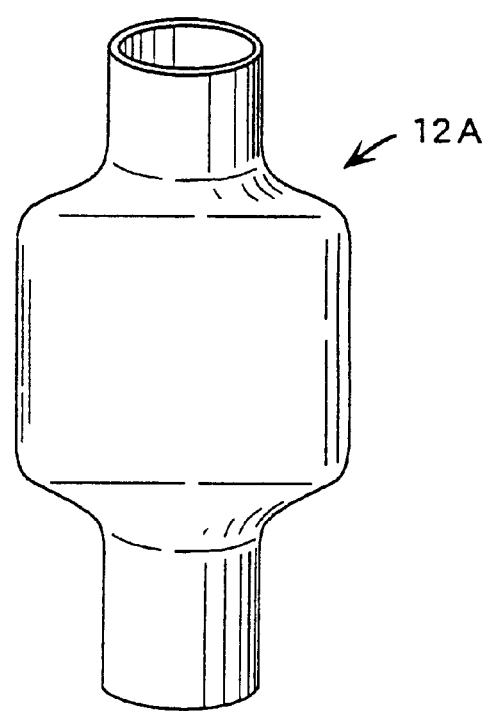
Figure 6C:
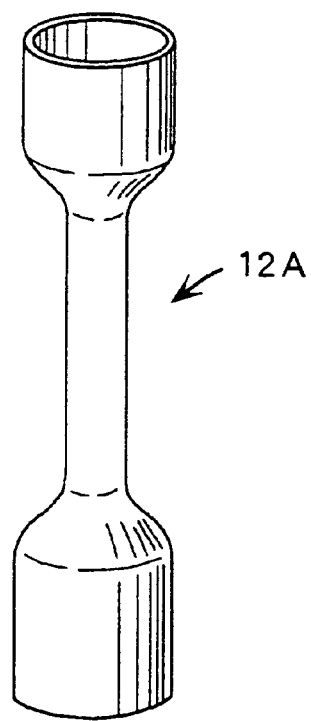
Figure 16A:
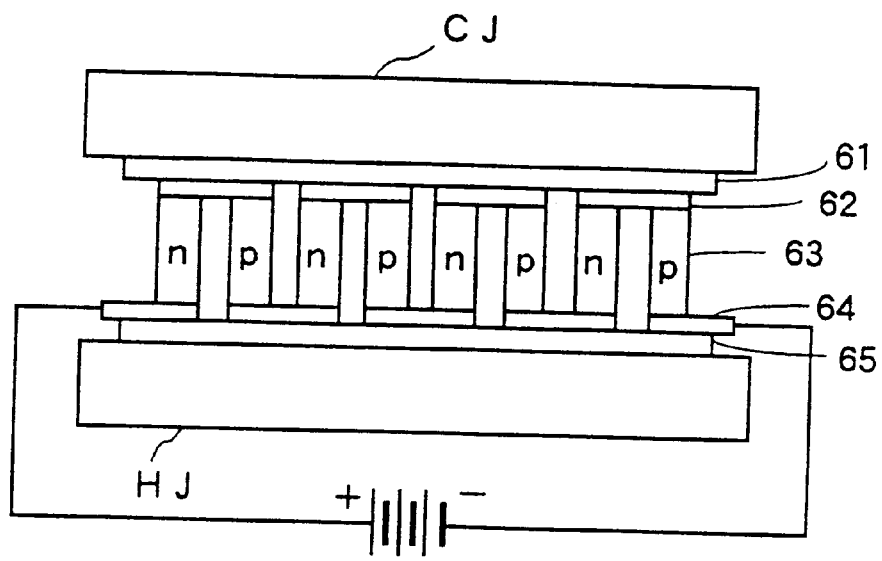
FIGS. 16A and 16B show shows the structure of a prior-art thermoelectric module.
Figure 16B:
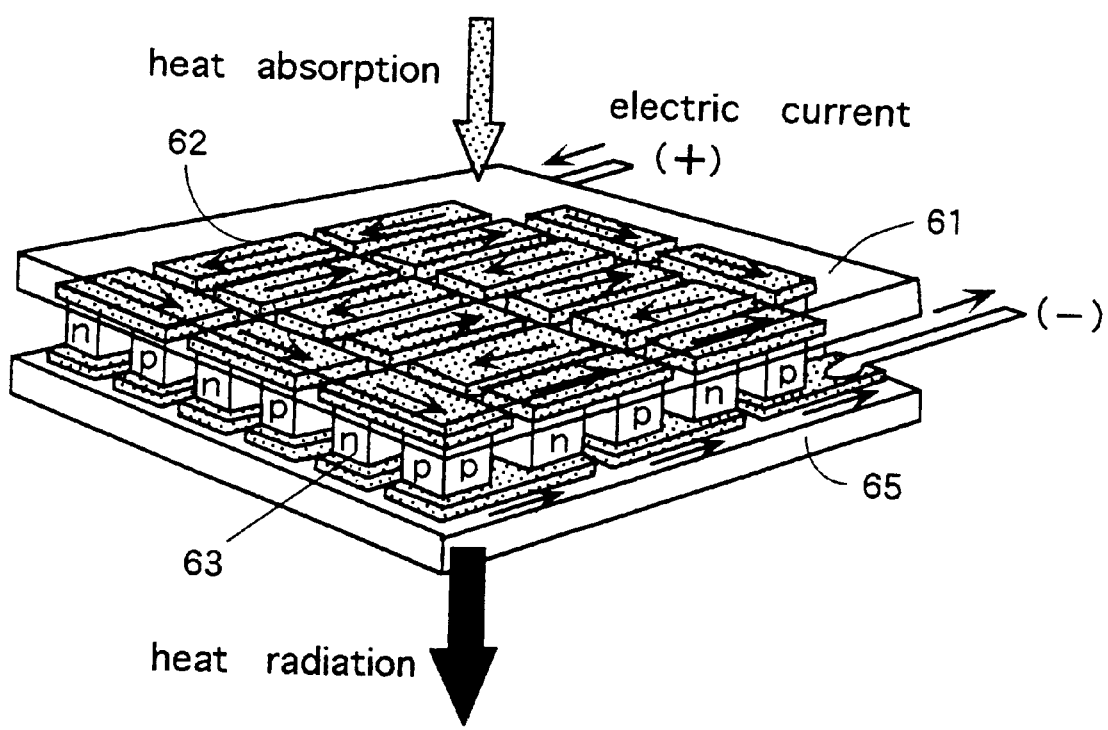

As shown in FIGS. 5, 6A, 6B and 6C, the heat exchange member 12A is provided in a central portion of the liquid temperature control unit 12. The heat exchange member 12A is formed from a circular cylindrical pipe 12M of a material that has good thermal conductivity, such as copper or aluminum, having a flat portion in a central portion thereof that is formed by squashing that central portion, as shown in FIGS. 6B and 6C. The heat-absorbing side of a thermoelectric element 12B is fixed to this flat portion. Note that this thermoelectric element 12B could be of the type shown in FIG. 16 or of the type shown in FIG. 1. An insulating member 12E is disposed around the periphery of the heat exchange member 12A, except for the portion thereof to which the thermoelectric element 12B is fixed. A casing 14 is configured in such a manner that an airflow generated by a fan 13 strikes both the radiator 10 and a heat sink 12C. The configuration is such that coolant which has been expelled from the radiator 10 passes through the heat exchange member 12A and the pump 11, then is supplied back to the liquid inlet 9A.

The operation of the liquid temperature control unit 12 of FIG. 5 will now be described. Note that the solid arrows in this figure indicate the flow of coolant and the hollow arrows indicate the flow of air. Coolant that has been expelled from the liquid outlets 9B of the circulating-fluid thermoelectric cooling unit 9 of FIG. 4, at an elevated temperature, enters the radiator 10 where it is cooled by the airflow from the fan 13, and it is then propelled on to the heat exchange member 12A of the liquid temperature control unit 12. The coolant that has been propelled into the heat exchange member 12A is cooled to a constant temperature by the thermoelectric element 12B at the flat portion, then is supplied through the pump 11 into the interior of the circulating-fluid thermoelectric cooling unit from the liquid inlet 9A. Coolant whose temperature has been raised by absorbing the heat generated by the heat-radiating side of the circulating-fluid thermoelectric cooling unit is output from the liquid outlets 9B and is once again propelled on to the radiator 10.

Figure 7:
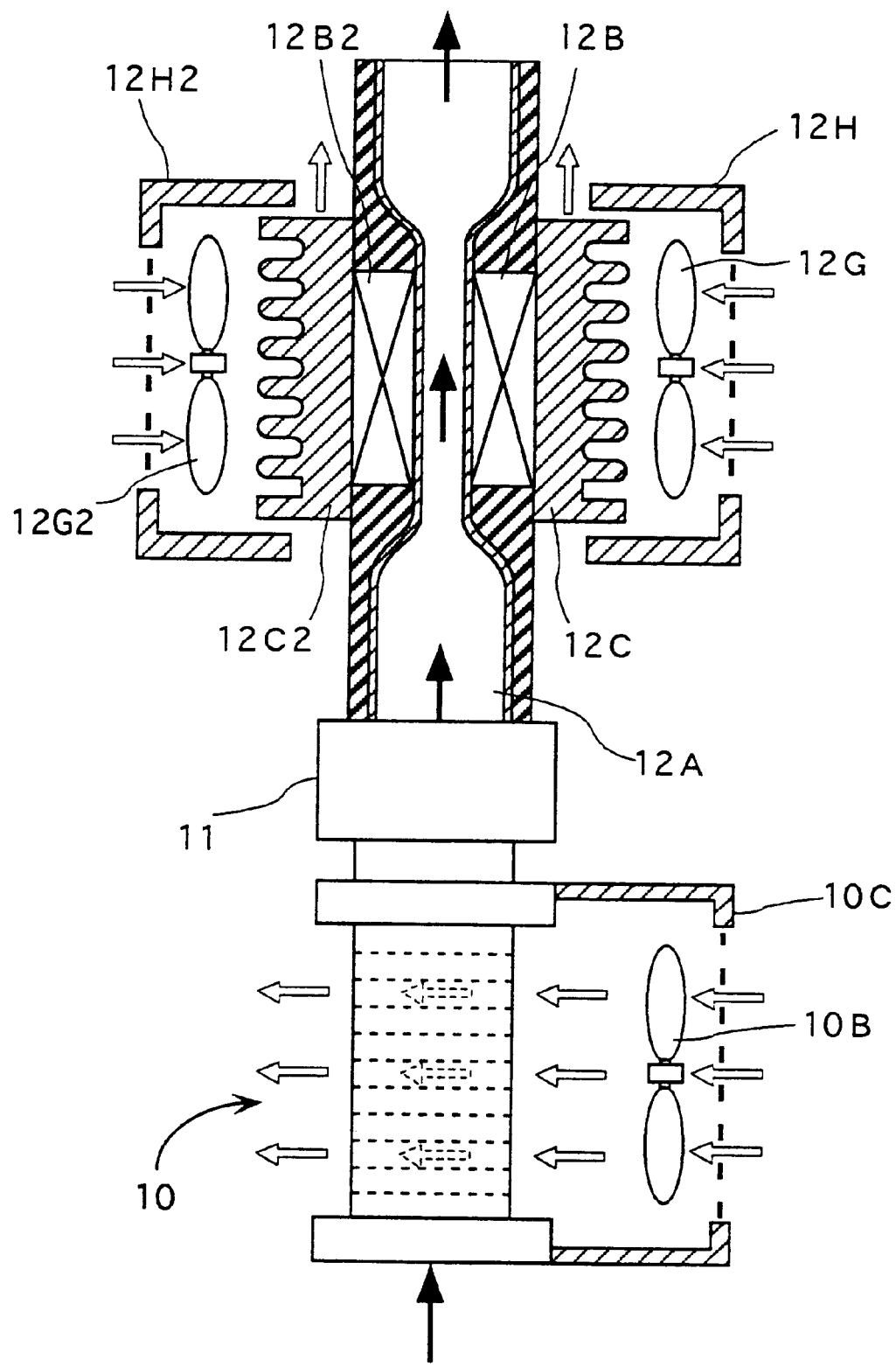
FIG. 7 shows another example of the structure of the liquid temperature control unit of FIG. 4.

A further example of the structure of the liquid temperature control unit 12 is shown in FIG. 7. In this figure, components that are the same as those shown in FIG. 5, or are equivalent to those shown in FIG. 5, are denoted by the same reference numbers as those used in FIG. 5. In this example of the structure, a fan 10B is provided for the radiator 10 and a separate fan 12G is provided for the liquid temperature control unit 12. Use of such a configuration makes it possible to operate the fan 10B at minimum speed and flowrate, thus increasing the quietness thereof. A thermoelectric element 12B2, a heat sink 12C2, a fan 12G2, and a fan casing 12H2 could also be added on the opposite side from the thermoelectric element 12B, the heat sink 12C, the fan 12G, and a fan casing 12H. Since temperature control can be provided on both sides of the flat portion of the heat exchange member 12A with this configuration, the coolant temperature can be controlled more powerfully and also highly accurately.

Figure 8:
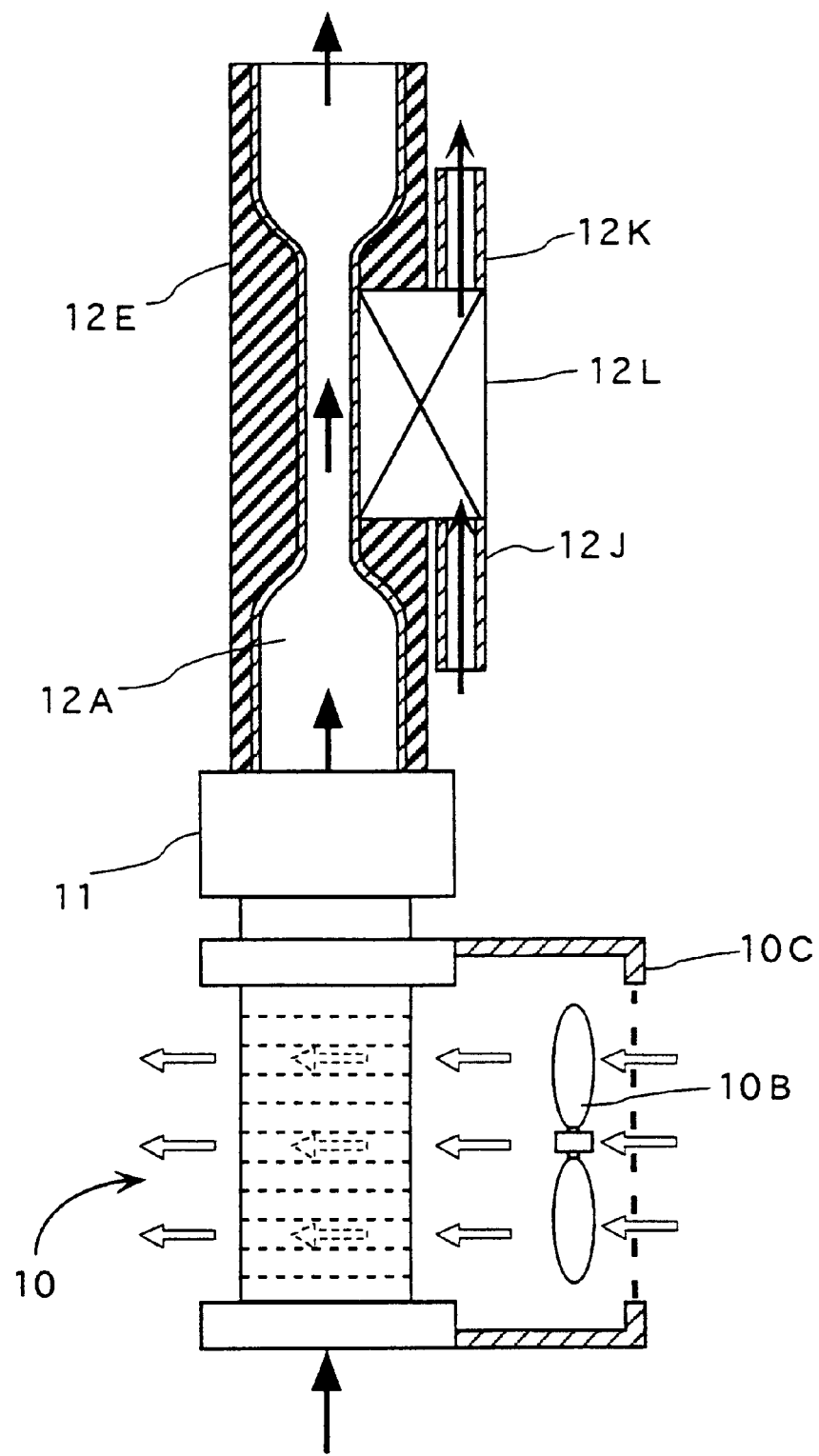
FIG. 8 shows a further example of the structure of the liquid temperature control unit of FIG. 4.
Figure 17A:
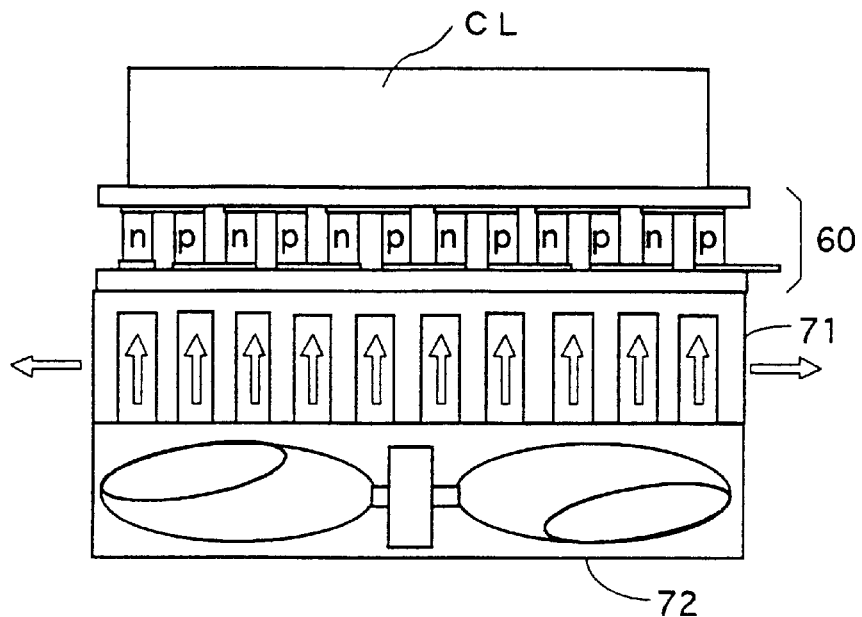
FIGS. 17A and 17B show the cooling method used in the prior-art thermoelectric module.
Figure 17B:
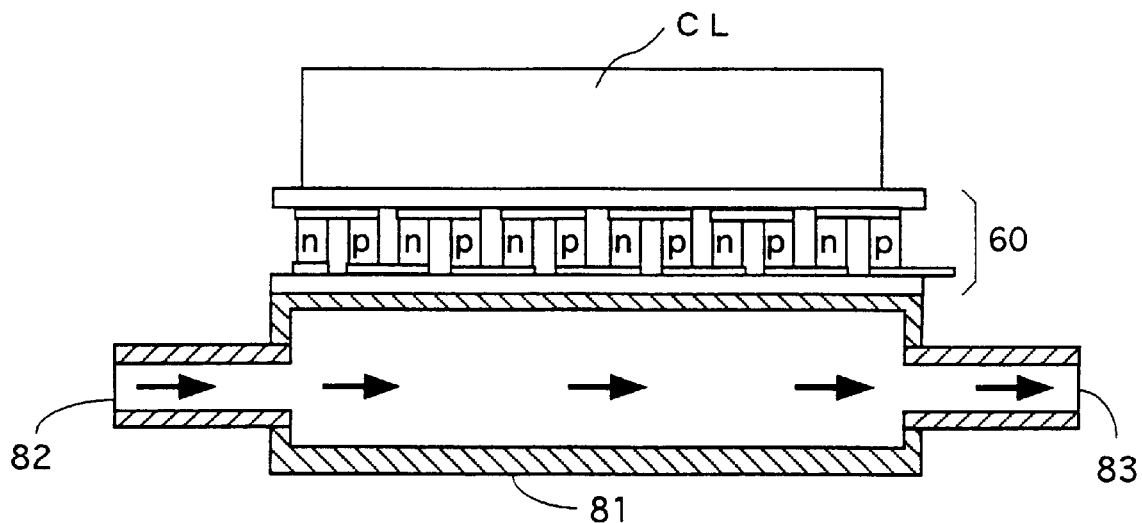

The structure of a still further example of the liquid temperature control unit 12 is shown in FIG. 8. In this figure, components that are the same as those shown in FIG. 5, or are equivalent to those shown in FIG. 5, are denoted by the same reference numbers as those used in FIG. 5. In this example of the structure, a liquid-cooling thermoelectric unit 12L is fixed to the flat portion of the heat exchange member 12A. This liquid-cooling thermoelectric unit 12L has the same construction as that shown in FIG. 2. Part of the coolant expelled by the pump 11 is supplied from a coolant supply pipe 12J into the liquid-cooling thermoelectric unit 12L, and coolant that has absorbed heat therein and is thus of a higher temperature is returned to the radiator through a coolant exhaust pipe 12K. In other words, this example of the structure of the liquid temperature control unit uses a liquid-cooling method, in contrast to the air-cooling method used in the previous two examples. Note that this liquid-cooling thermoelectric unit 12L could have the configuration shown in FIG. 17B, instead of that shown in FIG. 2. In addition, liquid-cooling thermoelectric units could be provided on both sides of the heat exchange member 12A, in a similar manner to that shown in FIG. 7.

Note that it is preferable that the flat portion at the central portion of the heat exchange member 12A and the region extending from the outlets 9B of the thermoelectric cooling unit, through the radiator 10, and as far as the inlet of the liquid temperature control unit 12 are made of a material with good thermal radiation properties. It is also preferable that the other portions of the structure are made of a material with a high degree of thermal insulation, such as plastic or rubber.

Another example of the circulating-fluid thermoelectric cooling device in accordance with this invention is shown in FIG. 9. This device is characterized by using water from the water cistern of a toilet, or the like, to control the temperature of the coolant to be constant.

Figure 9A:
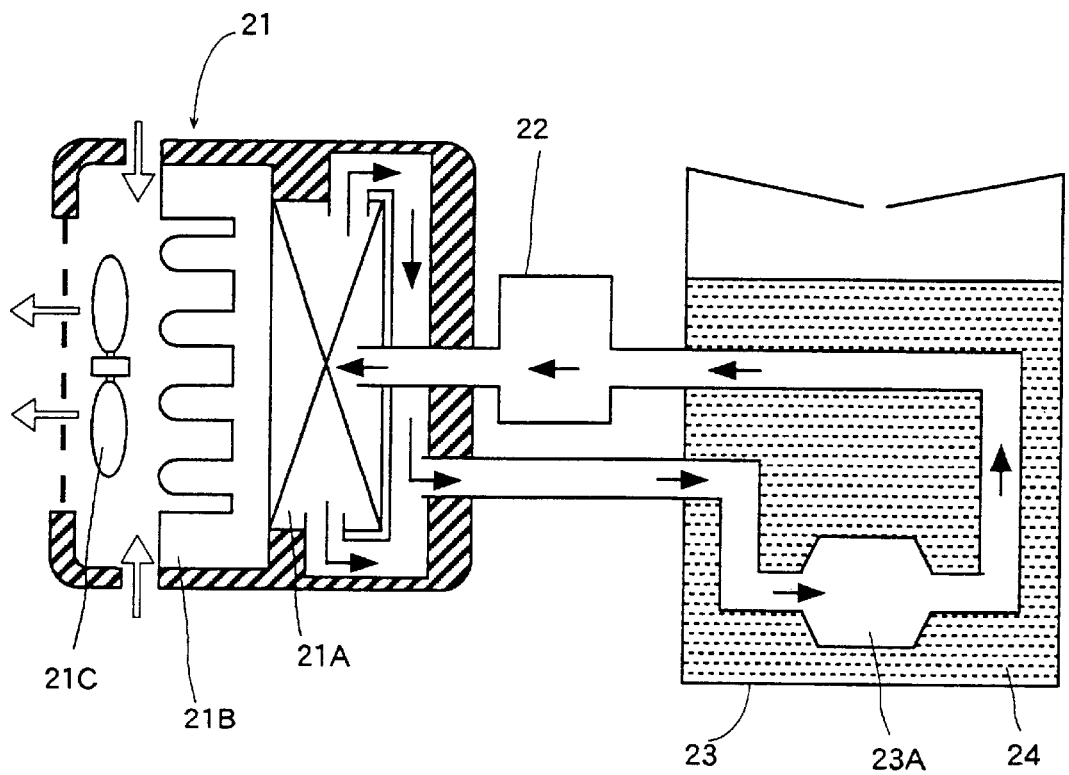
FIGS. 9A–9D shows another example of the structure of the thermoelectric cooling device of this invention.
Figure 9B:
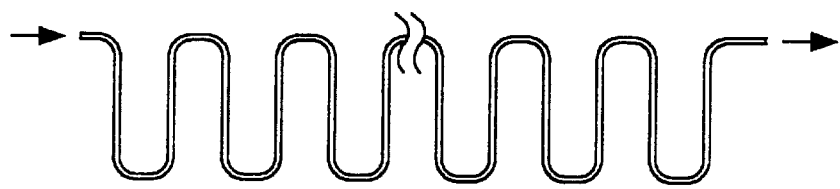
Figure 9C:
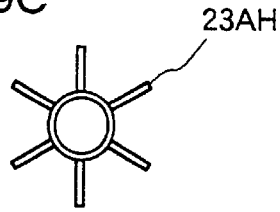
Figure 9D:
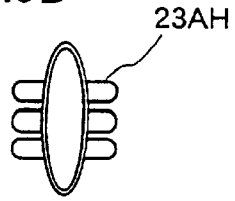

As shown in FIG. 9A, this circulating-fluid thermoelectric cooling device has a configuration such that coolant circulates between a liquid-cooling thermoelectric unit 21A within a cooling fan 21, a pump 22, and a water cistern 23. The liquid-cooling thermoelectric unit 21A is configured in the same manner as that shown in FIG. 2. A heat sink 21B is disposed on the heat-absorbing side thereof, and a fan 21C is disposed on the front side of the heat sink 21B. A heat exchange chamber 23A is disposed in the path of coolant within the water cistern 23. The configuration is such that a narrow pipe of a material with good thermal conductivity (such as aluminum or copper) is bent within the heat exchange chamber 23A to increase the surface area thereof in contact with the water, as shown in FIG. 9B, and thus increase the thermal radiation efficiency within the heat exchange chamber 23A. The section of this pipe could be circular or a flattened oval, as shown in FIGS. 9C and 9D. To further improve the thermal radiation effect, heat sinks (fins) 23AH could be attached to the outer periphery of this pipe. Note that the casing of the cooling fan 21 is made of a material such as plastic, so that the liquid-cooling thermoelectric unit 21A and the heat sink 21B is surrounded by a thermally insulating, waterproof structure.

The operation of the circulating-fluid thermoelectric cooling device of FIG. 9 will now be described. Since the heat sink 21B is cooled by the liquid-cooling thermoelectric unit 21A, the fan 21C on the front side thereof propels out a cool airflow from the front side of the cooling fan 21. At the same time, coolant that has been supplied to the liquid-cooling thermoelectric unit 21A from the pump 22 absorbs heat from the heat-radiating side of the liquid-cooling thermoelectric unit 21A and its temperature rises, then it is supplied into the water cistern 23. After it has released heat in the heat exchange chamber 23A within the water cistern 23, the coolant is propelled by the pump 22 back into the liquid-cooling thermoelectric unit 21A. Thus a cool airflow is propelled constantly from the front of the cooling fan 21.

During this time, new water is supplied into the water cistern 23 every time the toilet is used, so that the water temperature does not rise and remains substantially constant, even when the cooling fan 21 is used continuously for a long period of time. Therefore, the temperature of the coolant is also substantially constant. Since the temperature of the coolant in the device shown in FIG. 9 is controlled by using the water in the water cistern 23 in this manner, it is not necessary to use electrical power to control the temperature. In addition, the structure of the heat exchange chamber 23A is simpler than that of a radiator.

Figure 10A:
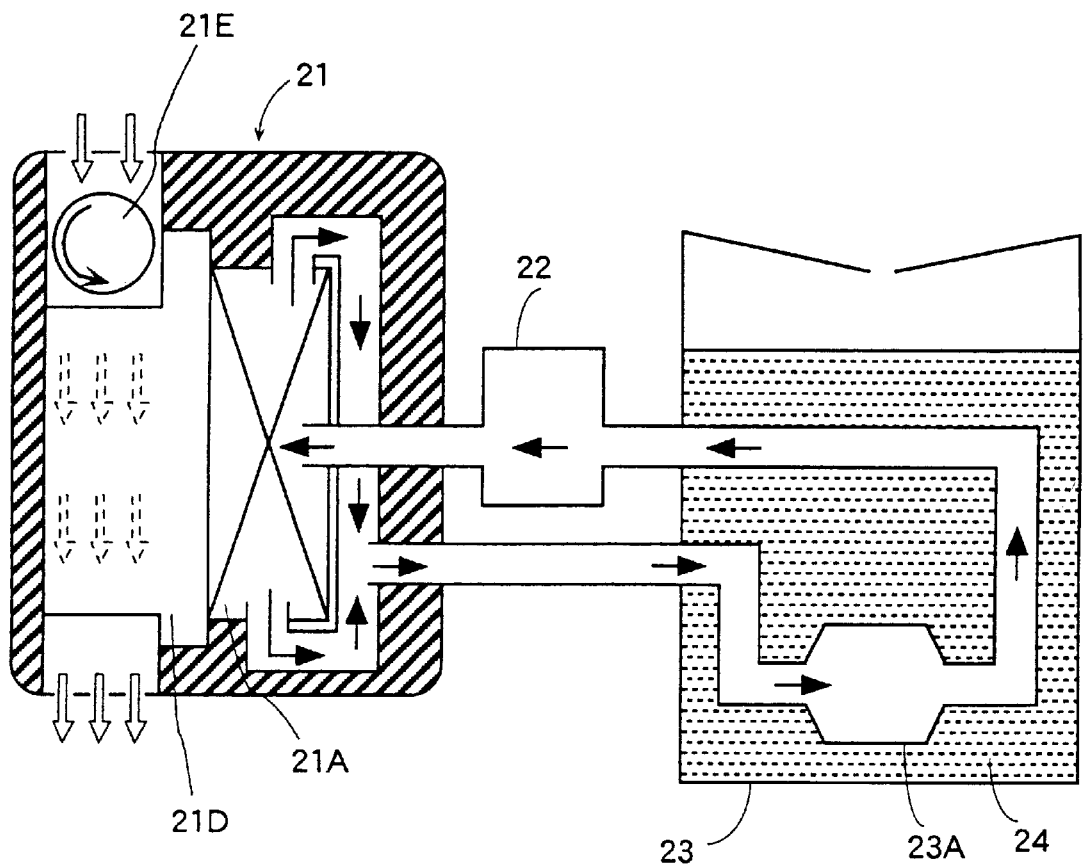
FIGS. 10A–10C show a further example of the structure of the thermoelectric cooling device of this invention.
Figure 10B:
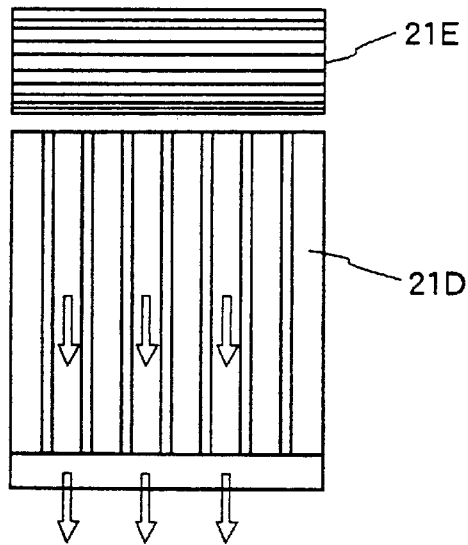
Figure 10C:
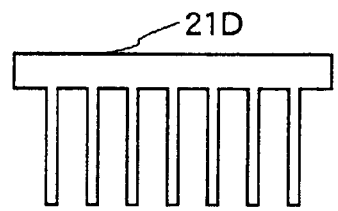

A further example of the structure of a circulating-fluid thermoelectric cooling device utilizing this invention is shown in FIG. 10. This device uses the water from the water cistern of a toilet to control the temperature of the coolant to be constant, in a similar manner to the device of FIG. 9. However, this device differs from the device of FIG. 9 in that an airflow generated by a cylindrical fan 21E is cooled by a heat sink 21D then is propelled to the outside from a side surface of the cooling fan 21. FIG. 10B is a view of the cylindrical fan 21E and the heat sink 21D as seen from the direction along the axis of the cylindrical fan 21E, and FIG. 10C is a view of the heat sink 21D as seen from the side of the cylindrical fan 21E. The use of such a cylindrical fan makes the flow of air smoother and thus further increases the quietness of the device.

It should be noted that, although the above embodiments were described as controlling the temperature of a coolant in a circulating-fluid thermoelectric cooling unit, they can equally well operate as thermoelectric heating units if the polarity of a current applied to the thermoelectric semiconductor elements thereof is inverted. In other words, the device shown in FIG. 4 can be adapted to act as a circulating-fluid thermoelectric heating device and the devices shown in FIGS. 9 and 10 can be adapted to act as heating fans.

Figure 11:
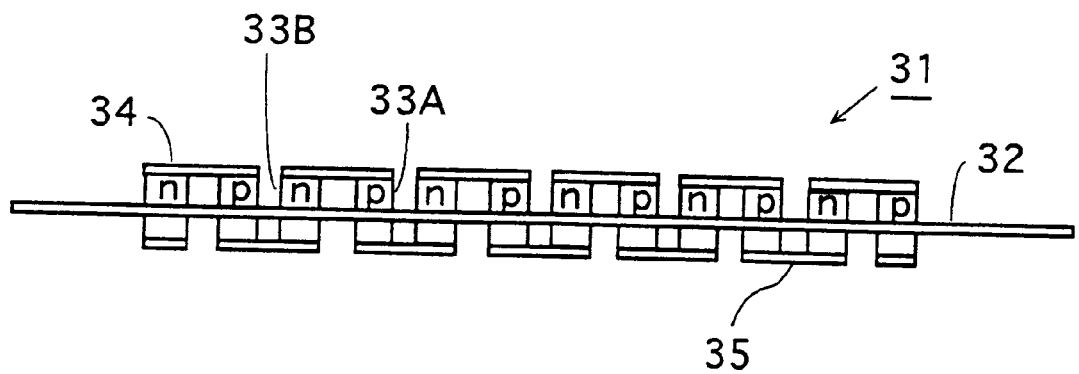
FIG. 11 is a front view of another example of the structure of a thermoelectric element in accordance with this invention.

A front view of another example of the structure of a thermoelectric element in accordance with this invention is shown in FIG. 11. This thermoelectric element 31 has a configuration in which p-type thermoelectric semiconductor elements 33A and n-type thermoelectric semiconductor elements 33B are fixed to a partitioning plate 32 in a state in which they pass therethrough. Flat copper electrodes 34 and 35 are connected by soldering to the upper side and lower side, respectively, of the p-type thermoelectric semiconductor elements 33A and the n-type thermoelectric semiconductor elements 33B. In other words, the shape of the copper electrodes on the lower side of this thermoelectric element 31 is flat; not T-shaped as in the thermoelectric element 1 of FIG. 1. Since this thermoelectric element has the same double-sided skeleton structure as that of the thermoelectric element of FIG. 1, the thermal stresses applied to the thermoelectric semiconductor elements are reduced thereby and, as a result, the lifetime of the thermoelectric semiconductor elements is extended. In addition, the heat-radiating side can be cooled directly, thus increasing the thermal radiation efficiency.

Figure 12:
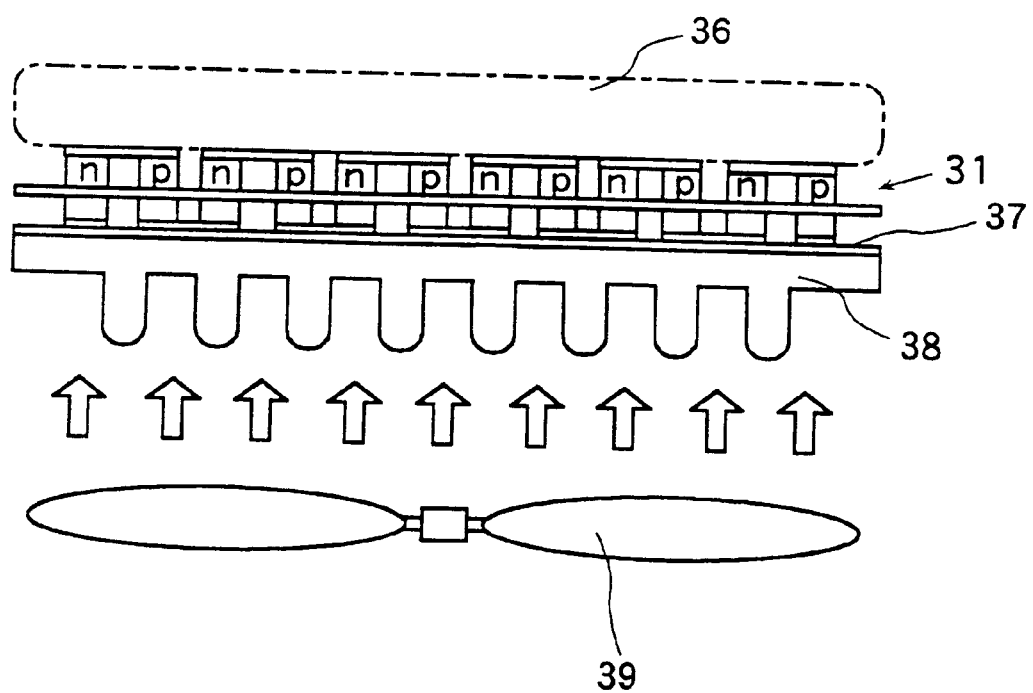
FIG. 12 shows the cooling method used by the thermoelectric element of FIG. 11.

The cooling method used by the thermoelectric element of FIG. 11 is shown in FIG. 12. As shown in this figure, a heat sink 38 is fixed to the copper electrodes on the lower side of the thermoelectric element 31, with an electrical insulation layer 37 having good thermal conductivity properties therebetween. Air (an airflow) is propelled from a fan 39 directed towards the heat sink 38. An object to be cooled (cooling load) 36 is fixed to the copper electrodes on the upper side of the thermoelectric elements 31. In other words, this cooling method is an air-cooled method.

Figure 13:
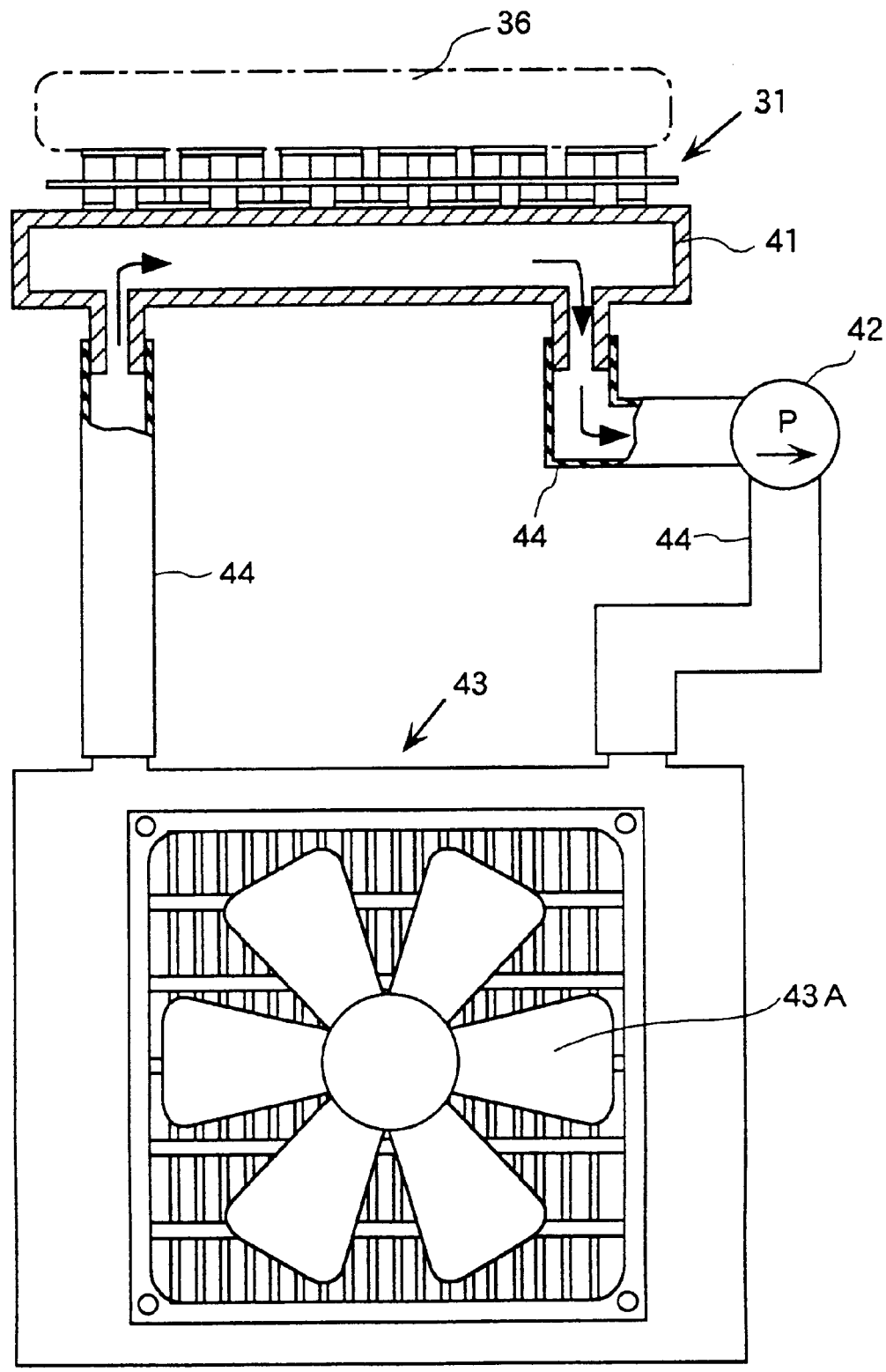
FIG. 13 shows an example of the structure of a thermoelectric cooling device using the thermoelectric element of FIG. 11.

The structure of a circulating-fluid thermoelectric cooling device that uses the thermoelectric element 31 of FIG. 11 is shown in FIG. 13. In this thermoelectric cooling device, a liquid-cooling unit 41 is fixed to the copper electrodes on the lower side of the thermoelectric element 31 with an electrical insulation layer (not shown in the figure) having good thermal conductivity properties therebetween. The object to be cooled 36 is fixed to the copper electrodes on the upper side of the thermoelectric element 31, with an electrical insulation layer having good thermal conductivity properties therebetween. The liquid-cooling unit 41 is made of a metal that is highly thermally conductive, such as aluminum, and is configured in such a manner that a coolant can pass therethrough. The liquid-cooling unit 41 is connected by a pipe 44 to a pump 42 and a radiator 43, with the configuration being such that the action of the pump 42 circulates the coolant. The interior of the radiator 43 is provided with a large number of fins (not shown in the figure). The coolant flowing within the radiator is cooled by the propulsion of an airflow from a fan 43A onto these fins. The supply side for the coolant within the pipe 44 is preferably configured of a material with a high degree of thermal insulation, such as a plastic or rubber pipe.

In the circulating-fluid thermoelectric cooling device of FIG. 13, the copper electrodes on the upper side of the thermoelectric element 31 form a heat-absorbing side and the copper electrodes on the lower side form a heat-radiating side. Heat emitted from the copper electrodes on the lower side is absorbed by the coolant flowing within the liquid-cooling unit 41. Coolant that has absorbed heat and is thus at an increased temperature is propelled on to the radiator and cools as it flows within the radiator 43. It then re-enters the liquid-cooling unit 41 and absorbs heat. The object to be cooled, which is fixed to the copper electrodes on the upper side of the thermoelectric element 31, can be cooled by repeating this process.

Figure 14:
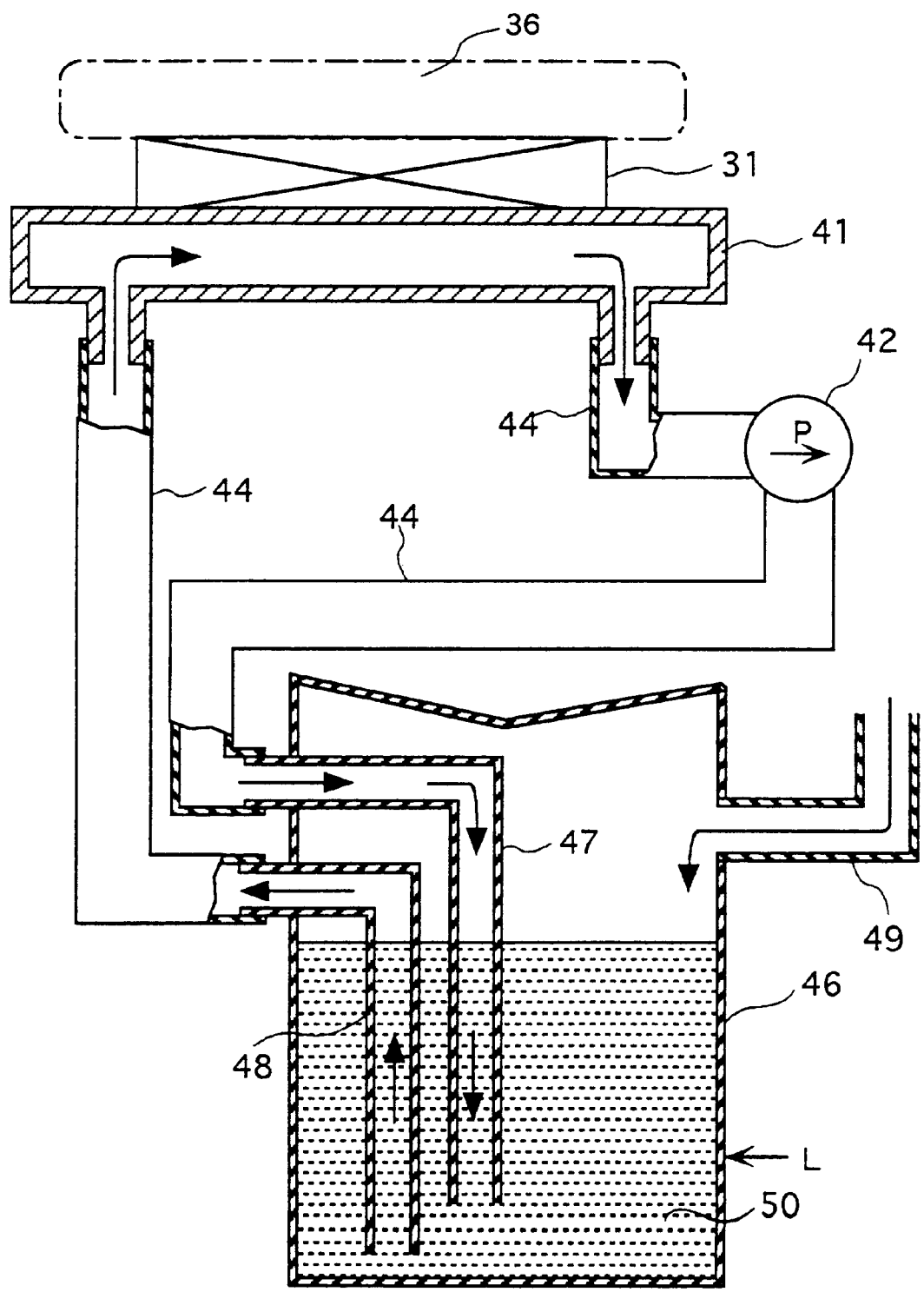
FIG. 14 shows another example of the structure of the thermoelectric cooling device using the thermoelectric element of FIG. 11.

Another example of the structure of a circulating-fluid thermoelectric cooling device that uses the thermoelectric element 31 of FIG. 11 is shown in FIG. 14. In this figure, components that are the same as those shown in FIG. 13, or are equivalent to those shown in FIG. 13, are denoted by the same reference numbers as those used in FIG. 13.

The configuration shown in FIG. 14 is similar to that of FIG. 13 in that the liquid-cooling unit (a water-cooled unit in this case) 41 is fixed to the copper electrodes on the lower side of the thermoelectric element 31 and the object to be cooled is fixed to the electrodes on the upper side thereof. Water is circulated by the action of the pump 42, in the same way as in the configuration shown in FIG. 13. In this circulating-fluid thermoelectric cooling device water at an increased temperature is used as a cooling means, and water within a water tank 46 is utilized therefor. The water tank 46 is provided with a water inlet pipe 47, a water outlet pipe 48, and a water supply pipe 49. The lower end of the water inlet pipe 47 extends as far as partway within the portion of the water tank 46 that is filled with water, and the lower end of the water outlet pipe extends as far as close to the bottom of the water tank 46. Note that the solid arrows in this figure indicate the flow of water.

Water that has been expelled from the pump 42 flows into the water tank 46 from the water inlet pipe 47. Water that flows out from the water outlet pipe 48 flows through the pipe 44 and into the liquid-cooling unit 41. The water supply pipe 49 supplies water to the water tank 46 to ensure that the water level within the water tank 46 is at least at a predetermined minimum level L. It is preferable that the water cistern shown in FIGS. 9 and 10 is used as this water tank 46, to ensure a supply of water at a substantially constant temperature.

In the circulating-fluid thermoelectric cooling device of FIG. 14, water within the liquid-cooling unit 41 that has absorbed heat and is thus at an increased temperature flows from the water inlet pipe 47 into the water tank 46. Since the lower end of the water outlet pipe 48 extends as far as close to the bottom of the water tank 46, water at a comparatively low temperature within the water tank 46 is expelled out from the water outlet pipe 48. The water that has thus been expelled out flows through the pipe 44 into the liquid-cooling unit 41, where it absorbs heat. The object to be cooled, which is fixed to the copper electrodes on the upper side of the thermoelectric element 31, can be cooled by repeating this process. In this case, it is preferable that the water tank 46 has a configuration that enables the supply of water at a substantially constant temperature, such as a water cistern by way of example.

Figure 15:
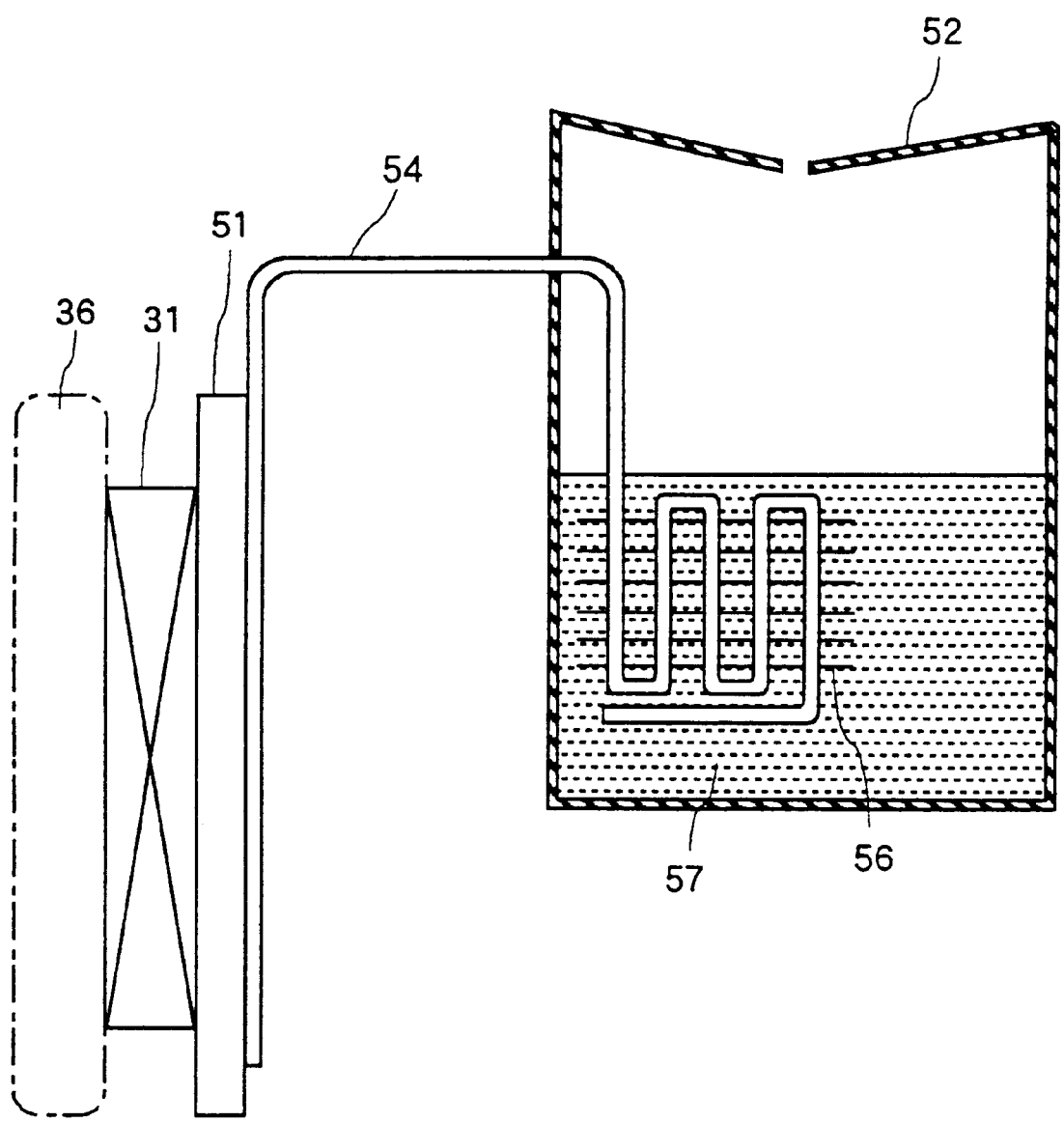
FIG. 15 shows a further example of the structure of the thermoelectric cooling device using the thermoelectric element of FIG. 11.

A further example of the structure of a thermoelectric cooling device using the thermoelectric element 31 of FIG. 11 is shown in FIG. 15. In this thermoelectric cooling device, a metal plate 51 is fixed to the copper electrodes on the right side of the thermoelectric element 31 (corresponding to the lower side in FIG. 11) an electrical insulation layer (not shown in the figure) having good thermal conductivity properties therebetween. The object to be cooled 36 is fixed to the copper electrodes on the left side of the thermoelectric element 31, with an electrical insulation layer having good thermal conductivity properties therebetween. The metal plate 51 is made of a metal that is highly thermally conductive and is also formed to be flat. A flat or circular cylindrical heat pipe 54 is brazed to the surface of the metal plate 51 opposite to the surface thereof fixed to the thermoelectric element 31. The end of the heat pipe 54 that is opposite to that fixed to the metal plate 51 is accommodated within a water tank 52 and a tip portion thereof is immersed in water 57. It is preferable that the water tank 52 has a configuration that enables the supply of water at a substantially constant temperature, such as a water cistern by way of example. The portion of the heat pipe 54 that is immersed in the water 57 is provided with fins 56.

In the thermoelectric cooling device shown in FIG. 15, when the metal plate 51 has absorbed heat and is thus at an increased temperature, that heat is transferred within the heat pipe 54 and moves to the portion thereof that is immersed in the water 57, and it is cooled by the water 57. In other words, an operating fluid that is sealed within the heat pipe 54 is heated and evaporates to form steam. During this time, heat is absorbed by the latent heat of evaporation thereof. This steam moves towards the low-temperature portion (the portion immersed in water). It is cooled by the low-temperature portion and condenses back into a fluid. During this time, heat is emitted by the latent heat of condensation thereof. The condensate returns to the high-temperature portions (on the metal plate 51 side), and the cycle of steam generation/movement/condensation is repeated. In this thermoelectric cooling device, there is no need for a pump for moving the cooling medium.

It should be obvious to those skilled in the art that the cooling devices shown in FIGS. 12 to 14 can also be made to function as heating devices, by inverting the polarity of the current applied to thermoelectric element 31.

INDUSTRIAL APPLICABILITY

A thermoelectric element unit in accordance with the invention described above can be used as a cooling or heating device. A cooling or heating device in accordance with this invention can be used as a cooling device for a semiconductor integrated circuit, or a cooling or heating device for a refrigerator, a cooling fan, or a heating fan.

What is claimed is:

1. A thermoelectric element comprising:
   (a) a partitioning plate having electrical insulating properties;
   (b) a p-type thermoelectric semiconductor element and an n-type thermoelectric semiconductor element fixed to said partitioning plate in a state passing through said partitioning plate;
   (c) a first metal electrode connected to a first surface of said p-type thermoelectric semiconductor element and said n-type thermoelectric semiconductor element; and
   (d) a second metal electrode connected to a second surface of said p-type thermoelectric semiconductor element and said n-type thermoelectric semiconductor element;
   wherein the shape of at least one of said first metal electrode and said second metal electrode is selected from the group consisting of: a T-shape, an inverted U-shape, an inverted L-shape and a π-shape.

2. The thermoelectric element as defined in claim 1, wherein said first metal electrode and said second metal electrode have the same shape.

3. The thermoelectric element as defined in claim 1, wherein said first metal electrode and said second metal electrode have mutually different shapes.

4. The thermoelectric element as defined in claim 3, wherein the shape of said second metal electrode is such that the surface area of the surface thereof fixed to said p-type thermoelectric semiconductor element and said n-type thermoelectric semiconductor element is greater than the surface area of the surface opposite thereto.

5. A thermoelectric cooling or heating device comprising:
   (a) a partitioning plate having electrical insulating properties;
   (b) a p-type thermoelectric semiconductor element and an n-type thermoelectric semiconductor element fixed to said partitioning plate in a state passing through said partitioning plate;
   (c) a first metal electrode connected to a first surface of said p-type thermoelectric semiconductor element and said n-type thermoelectric semiconductor element;
   (d) a second metal electrode connected to a second surface of said p-type thermoelectric semiconductor element and said n-type thermoelectric semiconductor element; and
   (e) a heat exchange vessel for accommodating said second metal electrode and the portions of said thermoelectric semiconductor element that protrude from said partitioning plate on the side of the second metal electrode and also for accepting the passage of a fluid for heat exchange therethrough;
   wherein the shape of at least one of said first metal electrode and said second metal electrode is selected from the group consisting of: a T-shape, an inverted U-shape, an inverted L-shape and a π-shape.

6. The thermoelectric cooling or heating device defined in claim 5, further comprising a liquid temperature control means for controlling the temperature of said fluid for heat exchange.

7. The thermoelectric cooling or heating device defined in claim 5, wherein said first metal electrode and said second metal electrode have the same shape.

8. The thermoelectric cooling or heating device defined in claim 5, wherein said first metal electrode and said second metal electrode have mutually different shapes.

9. The thermoelectric cooling or heating device defined in claim 8, wherein the shape of said second metal electrode is such that the surface area of the surface thereof fixed to said p-type thermoelectric semiconductor element and said n-type thermoelectric semiconductor element is greater than the surface area of the surface opposite thereto.

10. A thermoelectric cooling or heating device comprising:
  (a) a partitioning plate having electrical insulating properties;
  (b) a p-type thermoelectric semiconductor element and an n-type thermoelectric semiconductor element fixed to said partitioning plate in a state passing through said partitioning plate;
  (c) a first metal electrode connected to a first surface of said p-type thermoelectric semiconductor element and said n-type thermoelectric semiconductor element;
  (d) a second metal electrode connected to a second surface of said p-type thermoelectric semiconductor element and said n-type thermoelectric semiconductor element; and
  (e) a heat exchange vessel for accommodating said second metal electrode and the portions of said thermoelectric semiconductor element that protrude from said partitioning plate on the side of the second metal electrode and also for accepting the passage of a fluid for heat exchange therethrough,
  (f) a liquid temperature control means for controlling the temperature of said fluid for heat exchange, wherein said liquid temperature control means utilizes water within a vessel that is periodically replaced.

11. The thermoelectric cooling or heating device defined in claim 10, wherein said vessel is a water cistern.

* * * * *